United States Patent
Dodge

(10) Patent No.: US 8,859,040 B2
(45) Date of Patent: Oct. 14, 2014

(54) METHOD OF APPLYING ATOMIC LAYER DEPOSITION COATINGS ONTO POROUS NON-CERAMIC SUBSTRATES

(75) Inventor: Bill H. Dodge, Finlayson, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 265 days.

(21) Appl. No.: 13/392,213

(22) PCT Filed: Sep. 15, 2010

(86) PCT No.: PCT/US2010/048902
§ 371 (c)(1),
(2), (4) Date: Feb. 24, 2012

(87) PCT Pub. No.: WO2011/037798
PCT Pub. Date: Mar. 31, 2011

(65) Prior Publication Data
US 2012/0171376 A1    Jul. 5, 2012

Related U.S. Application Data

(60) Provisional application No. 61/244,713, filed on Sep. 22, 2009, provisional application No. 61/244,696, filed on Sep. 22, 2009.

(51) Int. Cl.
*C23C 16/00* (2006.01)
*C23C 16/455* (2006.01)
(Continued)

(52) U.S. Cl.
CPC .......... *C23C 16/045* (2013.01); *H01L 21/02422* (2013.01); *C23C 16/45525* (2013.01); *H01L 21/02428* (2013.01); *C23C 16/45546* (2013.01);
(Continued)

(58) Field of Classification Search
CPC .. C23C 16/045; C23C 16/403; C23C 16/405; C23C 16/45525; C23C 16/45544; C23C 16/54; C23C 16/545
See application file for complete search history.

(56) References Cited

U.S. PATENT DOCUMENTS

| | | |
|---|---|---|
| 4,726,989 A | 2/1988 | Mrozinski |
| 5,120,594 A | 6/1992 | Mrozinski |

(Continued)

FOREIGN PATENT DOCUMENTS

| | | |
|---|---|---|
| JP | 2001-279453 | 10/2001 |
| JP | 2005-306625 | 11/2005 |

(Continued)

OTHER PUBLICATIONS

Ritala et al., "Rapid Coating of Through-Porous Substrates by Atomic Layer Deposition", Chemical Vapor Deposition, vol. 12, 2006, pp. 655-658.*

(Continued)

*Primary Examiner* — David Turocy
(74) *Attorney, Agent, or Firm* — James A. Baker

(57) ABSTRACT

A method of depositing a conformal coating on a porous non-ceramic substrate requires reactive gases to flow through the substrate so as to leave a conformal coating behind. The process can be used to leave a hydrophilic surface on the interior pores of the substrate, even when the substrate is of a naturally hydrophobic, e.g., olefinic material. The method can be used in a roll-to-roll process, or in a batch process. In some convenient embodiments of the latter case, the batch reactor and the conformally coated substrate or substrates can together go on to be come part of the end product, e.g., a filter body and the filter elements respectively.

18 Claims, 1 Drawing Sheet

(51) Int. Cl.
*D06M 23/00* (2006.01)
*D06C 29/00* (2006.01)
*D06M 11/36* (2006.01)
*D06M 11/58* (2006.01)
*C23C 16/40* (2006.01)
*C08J 9/36* (2006.01)
*D06M 11/53* (2006.01)
*D06M 11/45* (2006.01)
*C23C 16/04* (2006.01)
*H01L 21/02* (2006.01)

(52) U.S. Cl.
CPC ............ *D06M 23/005* (2013.01); *D06C 29/00* (2013.01); *H01L 21/02532* (2013.01); *C23C 16/45555* (2013.01); *D06M 11/36* (2013.01); *D06M 11/58* (2013.01); *C23C 16/403* (2013.01); *C08J 9/365* (2013.01); *D06M 11/53* (2013.01); *D06M 11/45* (2013.01); *C08J 2201/038* (2013.01)
USPC ... 427/238; 427/210; 427/249.2; 427/255.29; 427/255.31

(56) References Cited

U.S. PATENT DOCUMENTS

| | | | |
|---|---|---|---|
| 6,613,383 B1 | 9/2003 | George et al. | |
| 6,713,177 B2 | 3/2004 | George et al. | |
| 6,913,827 B2 | 7/2005 | George et al. | |
| 7,045,205 B1 * | 5/2006 | Sager | 428/304.4 |
| 8,304,019 B1 * | 11/2012 | Pichler | 427/248.1 |
| 2002/0076491 A1 | 6/2002 | Delperier et al. | |
| 2004/0089237 A1 * | 5/2004 | Pruett et al. | 118/719 |
| 2004/0194691 A1 * | 10/2004 | George et al. | 117/84 |
| 2004/0213918 A1 | 10/2004 | Mikhael et al. | |
| 2005/0181198 A1 * | 8/2005 | David et al. | 428/304.4 |
| 2006/0156986 A1 | 7/2006 | Hiraga et al. | |
| 2006/0234210 A1 | 10/2006 | Kenan et al. | |
| 2007/0272606 A1 * | 11/2007 | Freese et al. | 210/500.25 |
| 2007/0281089 A1 | 12/2007 | Heller et al. | |
| 2008/0038524 A1 | 2/2008 | Rajala et al. | |
| 2008/0119098 A1 | 5/2008 | Palley et al. | |
| 2008/0241503 A1 | 10/2008 | Romdhane et al. | |
| 2008/0254312 A1 | 10/2008 | Groenen et al. | |
| 2008/0274282 A1 | 11/2008 | Bent et al. | |
| 2009/0067807 A1 | 3/2009 | Hirohata et al. | |
| 2009/0137043 A1 | 5/2009 | Parsons | |
| 2009/0304774 A1 * | 12/2009 | Liang et al. | 424/426 |
| 2010/0075131 A1 | 3/2010 | Etzel et al. | |
| 2010/0075560 A1 | 3/2010 | Seshadri et al. | |
| 2011/0226697 A1 | 9/2011 | McLellan et al. | |
| 2012/0058697 A1 | 3/2012 | Strickland et al. | |

FOREIGN PATENT DOCUMENTS

| WO | 2006/127946 | 11/2006 |
|---|---|---|
| WO | 2008/014977 | 2/2008 |
| WO | 2008/085183 | 7/2008 |
| WO | 2008/140578 | 11/2008 |

OTHER PUBLICATIONS

George, "Atomic Layer Deposition: An Overview", *Chem. Rev.*, 110, 2010, pp. 111-131.

Kemell et al., "Coating of Highly Porous Fiber Matrices by Atomic Layer Deposition", *Chemical Vapor Deposition*, vol. 14, (2008), pp. 347-352.

Junpeng et al., "Atomic Layer Deposition and Its Applications in Optical Thin Films", *Chinese Journal of Vacuum Science and Technology*, vol. 29, Issue 2, (2009), pp. 173-179.

* cited by examiner

METHOD OF APPLYING ATOMIC LAYER DEPOSITION COATINGS ONTO POROUS NON-CERAMIC SUBSTRATES

CROSS REFERENCE TO RELATED APPLICATION

This application claims the benefit of U.S. Provisional Patent Application Nos. 61/244,713 and 61/244,696, both filed Sep. 22, 2009, the disclosures of which are incorporated by reference herein in their entirety.

TECHNICAL FIELD

The present invention is related to the production of treated porous non-ceramic substrates, and more particularly to flow-through Atomic Layer Deposition processes for accomplishing this.

BACKGROUND

The Atomic Layer Deposition (ALD) process was originally developed for thin film electroluminescent (TFEL) flat-panel displays. Interest in ALD has increased significantly over the years, focusing on silicon-based microelectronics (wafers) due to its ability to produce very thin, conformable films with control of the composition and thickness of these films at the atomic level. ALD is also well known for its ability to coat high aspect ratio surfaces due to its self-limiting, sequential surface reaction process. However, the process' ability to coat these high aspect ratio surfaces is challenged by the time needed for the reactive gases to diffuse into these areas and be completely purged out prior to the addition of the next precursor. This diffusion problem has largely prevented the extension of this technology to porous materials.

SUMMARY

The present invention addresses the diffusion problem noted above by requiring all of the gases to pass through the porous non-ceramic materials to be coated. This eliminates the need for the gases to diffuse in and out of the surfaces of the targeted materials, reducing the time needed and minimizing the chance for incomplete coating coverage on the internal surfaces.

In one aspect, the present invention provides a method for depositing a conformal coating on a porous non-ceramic substrate, comprising:
  providing a reactor having an inlet and an outlet;
  positioning at least a portion of at least one porous non-ceramic substrate such that the porous non-ceramic substrate separates the inlet from the outlet;
  performing at least one iteration of sequentially introducing a first and a second reactive gas at the inlet such that the first and second reactive gases flow through the porous non-ceramic substrate to the outlet so as to conduct a sequence of two or more self-limiting reactions at the interior surfaces of the porous non-ceramic substrate to form a conformal coating on the interior surfaces.

DEFINITIONS

In connection with this disclosure, the word "porous" means that the substrate contains openings (i.e. "pores") sufficient that at least a gas can pass through it.

The word "microporous" means that the substrate contains pores having a median internal cross-sectional dimension (a "median pore size," e.g. a diameter for the case of cylindrical pores) of no greater than 1,000 micrometers such that a gas may pass through the substrate within the pores. Preferred microporous substrates include pores having a median pore size of from 0.01 to 1,000 micrometers, inclusive, more preferably from 0.1 to 100 micrometers, inclusive, even more preferably from 0.2 to 20 micrometers, inclusive, and most preferably from 0.3 to 3 micrometers or even 1 micrometer, inclusive. As used throughout this specification, median pore size was determined using the bubble point pressure measurement method described in ASTM Standard F316-03.

The word "nonporous" means that the substrate is substantially free of pores.

The word "non-ceramic" with reference to a substrate prior to deposition of the conformal coating means that the substrate does not substantially include inorganic metal oxides, metal nitrides, metal carbides, or other ceramic materials. Preferred "non-ceramic" substrates are completely free of ceramic materials, and more preferably consist essentially of fibrous organic materials (e.g. polymeric fibers, natural fibers, carbon fibers, and the like), and even more preferably consist only of organic materials.

The word "conformal coating" means a relatively thin coating of material that adheres well to and conforms closely to the shape of an underlying substrate.

DETAILED DESCRIPTION

Figure 1:
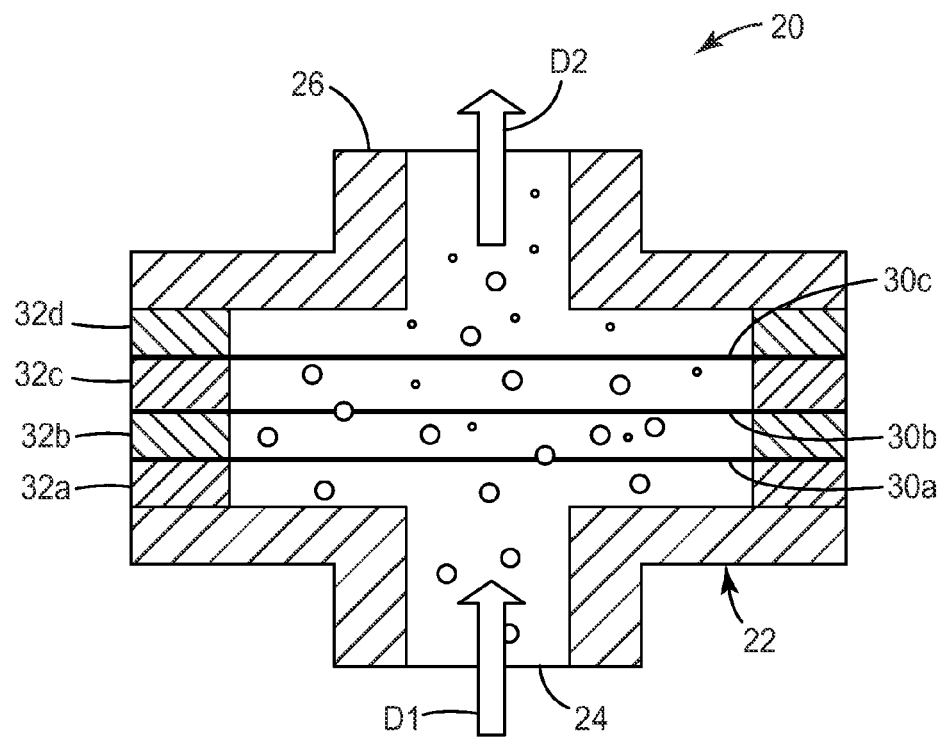
FIG. 1 shows a cross-section view through a reactor suitable for use in the method of present invention.

The method of the invention provides a conformal coating on at least a portion of the interior surfaces of non-ceramic substrate. In many convenient embodiments of the method, the conformal coating comprises a metal oxide, a metal nitride, a metal sulfide, or a combination thereof. The metal in these instances may be of various sorts, but silicon, titanium, aluminum, zirconium, and yttrium are considered particularly suitable. Preferably, the metal is silicon, titanium, or aluminum; more preferably, the metal is aluminum. In some preferred embodiments, the conformal coating comprises aluminum oxide.

Coatings that can be applied via atomic layer controlled growth techniques are preferred. Among coatings that are readily applied in such a manner are binary materials, i.e., materials of the form $Q_x R_y$, where Q and R represent different atoms and x and y are numbers that reflect an electrostatically neutral material. Among the suitable binary materials are various inorganic oxides (such as silicon dioxide and metal oxides such as zirconia, alumina, silica, boron oxide, yttria, zinc oxide, magnesium oxide, $TiO_2$ and the like), inorganic nitrides (such as silicon nitride, AlN and BN), inorganic sulfides (such as gallium sulfide, tungsten sulfide and molybdenum sulfide), as well as inorganic phosphides. In addition, various metal coatings are useful, including cobalt, palladium, platinum, zinc, rhenium, molybdenum, antimony, selenium, thallium, chromium, platinum, ruthenium, iridium, germanium and tungsten.

Useful discussions of the application of self-limiting sequential coatings can be found, for example, in U.S. Pat. Nos. 6,713,177; 6,913,827; and 6,613,383.

Those familiar with the field of ALD reactions can readily determine which first and second reactive gases are appropriate choices for the self-limiting reactions according to the present method in order to create the conformal coatings discussed above. For example, if an aluminum containing compound is desired, trimethylaluminum or triisobutylaluminum gases may be used as one of the two reactive gases. When the desired aluminum containing compound is aluminum oxide, the other reactive gas in the iterations can be water vapor or ozone. When the desired aluminum containing compound is aluminum nitride, the other reactive gas in the iterations can be ammonia or a nitrogen/hydrogen plasma. When the desired aluminum containing compound is aluminum sulfide, the other reactive gas in the iterations can be hydrogen sulfide.

Likewise, if instead of aluminum compounds, silicon compounds are wanted in the conformal coating, one of the two reactive gases can be, e.g., tetramethylsilane or silicon tetrachloride. The references incorporated above give further guidance about suitable reactive gases depending on the end result desired.

While a single iteration of the method can lay down a molecular monolayer that may be suitable for some purposes, many useful embodiments of the method will iterate the performing step for at least 8, 10, 20 or more iterations. Each iteration adds thickness to the conformal coating. Therefore, in some embodiments, the number of iterations is selected to achieve a predetermined porosity or average internal pore diameter in the porous non-ceramic substrate. In some embodiments, by controlling the number of iterations performed, the conformal coating can be used to controllably reduce the porosity of the porous non-ceramic substrate (e.g., to control the apparent pore size of the substrate) to achieve a desired porosity (e.g., a desired average internal pore diameter). For example, the conformal coating may reduce the porosity of the porous non-ceramic substrate by 5% or more, 25% or more, or even 50% or more. Similarly, if the substrate comprises pores, the conformal coating may reduce the average internal pore diameter by 5 nm or more.

In some applications, the purpose of applying the method is to achieve hydrophilicity on the interior surfaces of the substrate. In these applications, the step is iterated until a target surface energy such as, e.g., 72 dyne/cm (one commonly used definition of hydrophilic nature) is achieved. Further, it may also be desirable for the exterior surface of the porous non-ceramic substrate nearest the outlet to have a surface energy greater than 72 dyne/cm as well, and in these circumstances the performing step should be iterated until that target is achieved. Contrariwise, in some specialized embodiments it may be desirable to have the interior surfaces hydrophilic while the exterior surface of the porous non-ceramic substrate nearest the outlet is left hydrophobic (e.g., less than 72 dyne/cm).

The method of the invention can be carried out at any useful temperature that does not damage the substrate. In some embodiments, the method is carried out, e.g., at a temperature of about 300° C. or less, about 200° C. or less, about 70° C. or less, or even about 60° C. or less.

In many useful embodiments of the method, the porous non-ceramic substrate is a porous polymeric substrate. In such embodiments, it is often convenient that the introducing of the first and the second reactive gases be done at a temperature below the melting temperature of the porous polymeric substrate so as not to cause thermal distortion of the substrate or pores. For example, the method of the present invention can be operated at, e.g., below 300° C. if that is desirable for the structural integrity of the substrate.

When a porous polymeric substrate is employed with the method, it may be convenient to use substrates that have been rendered porous using an induced phase separation technique such as thermally induced phase separation (TIPS), vapor induced phase separation (VIPS), or the co-casting method of inducing phase separation discussed in U.S. Patent Application Publication No. US 2008/0241503.

Other ways of forming porous substrates from polymeric materials will commend themselves to the ordinary artisan for use with the present invention. For example, staple nonwovens such as stitchbonded or hydro-entangled webs may be used, as well as spunlaid non-wovens such as melt-blown or spun-bonded webs. For other applications, non-polymeric non-ceramic materials such natural fabrics, carbon fibers, fritted metal, or glass can be suitable.

While the present invention requires positioning at least a portion of at least one porous non-ceramic substrate such that the porous polymeric substrate separates the inlet of the reactor from the outlet, it does not restrict the physical topology of the porous non-ceramic substrate. Depending on end use, the porous non-ceramic substrate may be flat, pleated, tubular, in the form of a thin hollow fiber, either singular or as a potted fiber cartridge, or any other useful configuration.

When employing the method, it is possible, and sometimes convenient, to position at least a portion of at least a second porous non-ceramic substrate such that the second porous non-ceramic substrate also separates the inlet from the outlet. It has been demonstrated that three or more porous non-ceramic substrates can be successfully treated simultaneously using the method.

The porous non-ceramic substrate can be treated in a batch process, or the porous non-ceramic substrate may by in the form of a web of material of indefinite length and the positioning means can be of a type that permits a roll-to-roll process. Such a roll-to-roll process may be of the step-and-repeat sort, or it can be a continuous motion process.

One convenient variant of the method is to perform the process in a batch reactor such that the reactor itself is incorporated into the product intended for the end consumer. For example, the reactor may be in the form of a filter body, and both the filter body and the porous non-ceramic substrate with its conformal coatings applied in situ can be part of a filter to be sold to the end user. In some embodiments, multiple filters can be simultaneously treated in series or parallel connected flow paths.

In many convenient embodiments, the porous non-ceramic substrate is suited to its end use once the conformal coating has been applied on the interior surfaces. However, it is sometimes useful to perform a secondary operation on the conformal coating. This can be done either within the reactor or in another convenient apparatus. For example, even in cases where the internal surfaces of the porous non-ceramic substrate have been rendered hydrophilic, one or both of the external surfaces of the porous non-ceramic substrate can be treated with a final size coating to render them hydrophobic. This technique could be used to prepare, e.g., a vent filter for an endotracheal tube that should pass only gas and water vapor, not liquid water.

Another secondary operation that can be performed is to graft chemical moieties to the conformal coating. For example, a discussion of a technique which can be extrapolated to provide a porous non-ceramic substrate with its conformal coating according to the present invention with grafted ligand groups, e.g., selected from polyethyleneimine ligand groups and biguanide ligand groups, can be found in U.S. Patent Application Publication Nos. US 2010/0075131 and US 2010/0075560. Grafting by radiant or particle energy can also be used to attach other useful ligands such as silanes, biologically active moieties such as antibodies, chelating agents, and catalytic coatings.

Porous non-ceramic substrates provided with conformal coatings according to the method of the present invention lend themselves to numerous uses. For example, the filtration of both liquids and gases may be enhanced by the use of the treated substrates. With regard to, e.g., water filtration, conformal coatings that provide hydrophilicity to a porous filter element can act to reduce resistance and enhance flow through a filter. This is especially useful when the filter is to be used under gravity flow conditions and low pressure applications. The physical size and spacing of the pores can be selected as well as the conformal coating to achieve particular effects. For example, the porous non-ceramic substrate can be fine fiber meltblown or nanofiber webs that have fiber-to-fiber spacings that can prevent the liquid from passing through the openings below a certain pressure, i.e., "liquid hold out".

Certain conformal coatings as described above can be used to reduce scale deposits from forming in filter elements made according to the present invention. This can be accomplished by applying, in a secondary operation, coating designed to reduce compatibility with the scale materials. Silver or other antimicrobial materials can also be bound to some of the described coatings to help prevent the formation and growth of bio-film on the surfaces of the porous non-ceramic substrate or to treat the liquid being filtered. Further, it is believed that, e.g., metal oxide coatings themselves, without secondary treatment, could allow such filters to operate at higher service temperatures, potentially enabling applications involving hot water or water/steam.

The filtration of other liquids besides water and its solutions can benefit from treated substrates according to the present invention as well. For example, conformal coatings that enable higher service temperatures could allow filtration of heated oils. Some conformal coatings could provide chemical resistance in acidic or high pH environments. A filter can be provided having several filter elements, each provided with variations of the present invention adapting them to restrict or adsorb different chemical contaminants, providing "depth filtration."

The treatments discussed above also lend themselves to applications in air filtration. As discussed above, conformal coatings could enable higher service temperatures in air filtration applications as well. It is contemplated that with sufficient iterations, air filters could be provided according to the present invention with sufficient heat resistance for, e.g., the filtration of diesel exhaust. Secondary antimicrobial, adsorptive, or catalytic coatings could adapt, e.g., melt-blown substrates for use as masks for biomedical use or as personal protective gear. For example, nano-gold catalysts could be bound to the conformal coating to allow it to act as a carbon monoxide remover in a protective mask.

Beyond filtration, the method of the present invention lends itself to the treatment of porous insulation. Anti-microbial materials applied in a secondary operation could reduce the potential for biological contamination in, e.g., moist environments. It is contemplated that with sufficient iterations, insulation with flame retardant properties could be provided.

Further, it is contemplated that porous non-ceramic substrates according to the present invention, especially with a biocompatiblizing layer added in a secondary operation, could be used a tissue scaffolds for diverse medical applications.

Certain porous non-ceramic substrates prepared according to the present invention may be particularly suitable for some applications. For example, polyvinylidene fluoride (PVDF) made hydrophilic can be particularly suitable for applications in filtration, substrates for anion exchange membranes, vent filters for endotracheal tubes, and sample preparation devices for food safety; nylon made hydrophilic can be particularly suitable for applications in protein purification and water purification (e.g., through attachment of quat silane); and non-woven made hydrophilic can be particularly suitable for applications such as cleaning wipes for infection prevention, depth filtration, and ample preparation devices for food safety.

Referring now to FIG. 1, a cross-section view through a reactor 20 suitable for use with the present invention is illustrated. The depicted reactor 20 is suited to batch processes in connection with the invention, and has a reactor body 22 including an inlet 24 and an outlet 26. The inlet 24 and the outlet 26 are on opposite sides of three separate portions of porous non-ceramic substrate 30a, 30b, and 30c such that reactive gasses introduced at inlet 24 in direction D1 must pass through all of portions of porous non-ceramic substrate 30a, 30b, and 30c to make their way to the outlet 26 in direction D2. In the depicted embodiment, portions of substrate 30a, 30b, and 30c are conveniently gripped at their edges by double-sided flanges 32a, 32b, 32c, and 32d, although skilled artisans will recognize that other expedients can be used for this purpose.

EXAMPLES

Objects and advantages of this invention are further illustrated by the following examples, but the particular materials and amounts thereof recited in these examples, as well as other conditions and details, should not be construed to unduly limit this invention.

Method of Testing the Surface Energies of Samples

Several samples of ALD coated porous non-ceramic substrates are described below in connection with the Examples. Where the surface energy of the sample is discussed, that reading was obtained in the following way: Dyne test solutions were obtained in various levels. Solutions according to ASTM Standard D-2578 ranging in level from 30 to 70 dynes/cm were purchased from Jemmco, LLC of Mequon, Wis. Solutions ranging in level from 72 to 86 dynes/cm were prepared by mixing the amount of $MgCl_2.6H_2O$ shown on Table 1 with sufficient deionized water to make a total of 25 grams of solution.

TABLE 1

| Level of dyne test solution being made (dyne/cm) | Grams of $MgCl_2 \cdot 6H_2O$ added to DI water to make a total of 25 grams of solution |
|---|---|
| 72 | 0.00 |
| 74 | 2.26 |
| 76 | 4.93 |
| 78 | 7.39 |
| 80 | 9.56 |
| 82 | 11.40 |
| 84 | 12.94 |
| 86 | 14.24 |

Using these dyne test solutions, the substrate needing testing as discussed below was subjected to the Drop Test discussed in section 12 of ASTM Standard ASTM D7541-09.

Preparation of Substrate A

A microporous polypropylene substrate was prepared using a Thermally Induced Phase Separation (TIPS) process generally as described in U.S. Pat. No. 5,120,594 (Mrozinski) and U.S. Pat. No. 4,726,989 (Mrozinski). More specifically, a nucleated polypropylene/mineral oil blend was prepared and extruded into a smooth, chilled casting wheel where the material underwent solid-liquid phase separation. A continuous substrate of this material was collected and passed through a 1,1,1-trichloroethane bath to remove the mineral oil. The microporous polypropylene substrate thus formed had a thickness of 244 μm (9.6 mil). The microporous polypropylene substrate was then tested according to ASTM Standard F316-03 and found to have an isopropanol alcohol bubble point pressure of 69.7 kPa (10.11 psi) corresponding to a bubble point pore size of 0.90 μm. Further, it had a porosity of 83.3%, and a pure water permeability of 477 L/(m²-h-kPa). The substrate was strongly hydrophobic, having a surface energy of 29 dyne/cm.

Preparation of Substrate B

Another microporous substrate was prepared from an ethyelene-chlorotrifluoroethylene copolymer (ECTFE), commercially available under the trade name and grade designation HALAR 902 by Solvay Advanced Polymers, L.L.C., of Alpharetta, Ga. This was accomplished by a TIPS process generally as described in U.S. Patent Application Publication No. US 2009/0067807. More specifically, microporous ECTFE substrate was made using a twin screw extruder equipped with a melt pump, neck tube, and sheeting die positioned above a patterned casting wheel positioned above a water-filled quench bath. Using this set-up, the microporous ECTFE substrate was made by melt extruding a casting dope comprising ECTFE a diluent, and a solvent; casting and then quenching the dope; solvent washing to remove the diluent; drying to remove the solvent; and stretching the resulting substrate to a finished thickness of 48 μm (1.9 mil). The microporous ECTFE substrate was then tested according to ASTM Standard F316-03. It was found to have an isopropyl alcohol bubble point pressure of 186.1 kPa (26.99 psi) corresponding to a bubble point pore size of 0.34 μm, a porosity of 65.3%, and a pure water permeability of 48 L/(m²-h-kPa). The membrane was hydrophobic, having a surface energy of 37 dyne/cm.

Preparation of Substrate C

Another microporous substrate, a nonwoven (meltblown) polypropylene web, was prepared as follows. Polypropylene pellets commercially available as Total 3960 from Total Petrochemical of Houston, Tex. were used to form meltblown web using conventional techniques, specifically extrusion of the molten polypropylene at a rate of 7.6 lb/hr and a melt temperature of 285° C. (nominal) through a 10 inch wide meltblowing die of the Naval Research Lab (NRL) type towards a collecting drum set a distance of 12 inches (30.5 cm) from the die. The resulting web was collected at 10 ft/min (305 cm/min). The observed basis weight was 67 g/m². The air temperature and velocity were adjusted to achieve an effective fiber diameter (EFD) of 7.9 microns. This EFD was calculated according to the method set forth in Davies, C. N., "The Separation of Airborne Dust and Particles," Institution of Mechanical Engineers, London Proceedings 1B, 1952.

Preparation of Substrate D

Another microporous substrate in the form of a graphite felt with a nominal thickness of 0.25 inch (6.35 mm), commercially available as "GRADE GH" from Fiber Materials, Inc., of Biddeford, Me., was obtained.

Preparation of Substrate E

Another microporous substrate in the form of a E-glass mat, commercially available as "1210NC" from 3M Company of St. Paul, Minn., was obtained.

Reactor

A reactor generally as depicted in FIG. 1 was constructed using three 6 inch (15.24 cm) diameter double side flanges commercially available as ConFlat Double Side Flanges (600-400-D CF) from Kimball Physics Inc. of Wilton, N.H. To this stack of flanges on what was to be the upstream side was attached one 6 inch (15.24 cm) diameter ConFlat Double Side Flange (600DXSP12) from Kimball Physics Inc., which has one ⅛" (0.32 cm) NPT side hole. This side hole was used to attach a Baratron (10 torr) pressure gauge, commercially available from MKS Instruments of Andover, Mass., so that the pressure during the process could be monitored. This stack of elements was capped on each end with a 6 inch diameter (15.24 cm) ConFlat Zero-Length Reducer Flange (600x275-150-0-T1) commercially available from Kimball Physics Inc. At each of the junctions in the stack, appropriate sized copper gaskets were used so as to make a good vacuum seal.

To this stack of elements, first a 2.75 inch (7 cm) diameter ConFlat Double Side Flanges (275-150-D CF) was attached to the inlet side, followed by a 2.75 inch (7 cm) diameter ConFlat Double Side Flanges with two ⅛" (0.32 cm) NPT Side Holes (275DXSP12 modified for 2 side holes versus standard 1 side hole), and further followed by a 2.75 inch (7 cm) diameter ConFlat Solid/Blank Flange. The two side holes are used for introducing the reactive gases as will be discussed below.

To this stack of elements, first a 25 ISO to 275 CF Reducer (QF25X275) was attached to the outlet side. That element was connected to the bottom of a 275 ConFlat 4 way Cross (275-150-X), itself also equipped with a 25 ISO to 275 CF Reducer. This expedient allowed an easier set up for faster removal of the main reactor body from the supporting system for sample loading and removal. The 275 ConFlat 4 way Cross was then connected to a XDS-5 Scroll pump (equipped with purging capability) via flexible Stainless Steel vacuum hose equipped with a gate valve for the vacuum source and control, a SRS PPR300 Residual Gas Analyzer with bypass sampling and a MKS Baratron (10 torr) gauge for post membrane pressure readout. A valved roughing/bypass line with a 1/16 inch (0.16 cm) drilled orifice was installed around the gate valve to allow for reduced pumping but was also found to be useful as a secondary pumping line to allow for greater reactor pressure during surface treatments.

Inlets for the first and the second reactive gases were disposed with the ⅛" NPT side holes in the 2.75 inch (7 cm) diameter ConFlat Double Side Flanges as discussed above. By having each of the first and the second reactive gases enter at its own port, any possibility of reaction occurring in the inlet lines is minimized. Further, the inlet line for the first reactive gas was equipped with a "T" connection that allowed for the addition of process nitrogen ($N_2$) into the line to maintain a continuous positive flow of gas out of the port to assure that there was no back streaming of any of the second reactive gas into the supply line for the first reactive gas.

As further protection against the inadvertent cross-contamination of the inlet lines for the first and the second reactive gases, the line for the first reactive gas was directed through a normally closed valve, and the line for the second reactive gas was directed through a normally open valve. These control ports two valves were set up to be activated in tandem by the same switch to assure that the two lines could not both be adding precursor gases to the reactor at the same time.

Each of the lines was secondarily controlled on and off by a separate valving system equipped with an in-line needle valve of the SS Metering Bellows-Sealed Valve type to precisely control the rate of flow of each of the precursor gases. Upstream of each of these metering valves was a flow control valve commercially available as 316L VIM/VAR UHP Diaphragm-Sealed Valve, commercially available from Swagelok Company of Solon, Ohio. Upstream of each of these flow control valves was a reactive gas supply tank in the form of a 300 mL capacity stainless steel bubbler, commercially available as catalog no. Z527068 from Sigma-Aldrich, of St. Louis, Mo. This reactor/apparatus as described above was equipped with diverse band heaters, heating tapes and cartridge heaters of conventional types to control the temperatures of the reactor and its gas supplies.

Exemplary embodiments of porous substrates having a conformal coating therein have been described above and are further illustrated below by way of the following Examples, which are not to be construed in any way as imposing limitations upon the scope of the present invention. On the contrary, it is to be clearly understood that resort may be had to various other embodiments, modifications, and equivalents thereof which, after reading the description herein, may suggest themselves to those skilled in the art without departing from the spirit of the present disclosure and/or the scope of the appended claims.

Example 1

Each of the double-sided flanges of the reactor was used to support a disc cut from the porous polypropylene membrane discussed above as Substrate A. Each of the three samples of the discs were placed inside the reactor by attaching the discs to the copper gaskets with double stick tape and placing the copper gaskets in the normal sealing locations between the 6 inch (15.24 cm) diameter ConFlat Double Side Flanges. As the reactor was sealed together and tightened to form the reactor body, the ConFlat Double Side Flange seals penetrated the membranes and formed an air tight seal via the conventional copper gasket sealing mechanism. This sealed reactor wall also helped to hold the membranes in place, and sealed the edges of the membranes to prevent any of the reactive gases from bypassing the membranes.

The reactor with the membranes in place was then attached to the vacuum and gas handling systems as previously described above. The first reactive gas supply tank was filled with trimethylaluminium (TMA) 97%, commercially available as catalog number 257222 from Sigma-Aldrich of St. Louis, Mo. The second reactive gas supply tank was filled with ACS reagent water commercially available as catalog number 320072 from Sigma-Aldrich. The system was slowly put under vacuum via the vacuum bypass valve to a pressure of between 1 to 10 torr. Once the vacuum was fully drawn, and with the vacuum system still operating, the reactor was flushed with a $N_2$ purge at a flow rate of 10 to 25 sccm to remove residual excess water and atmospheric gases and/or contaminants. While this was occurring, the reactor, first and second inlet lines, and purge gas lines were heated to 50° C. with the heaters. The first gas supply tank was similarly heated to 30° C.

After the system had been purged and the heaters had stabilized at their respective set points, the first reactive gas was released from the first reactive gas supply tank. The needle valve on the first reactive gas line was adjusted so that the gas flow, given the influence of the vacuum system, corresponded to an $N_2$ equivalent flow rate of 1 to 25 sccm flowing through the discs to the exit. After the first reactive gas had fully saturated the surfaces of the three discs (as detected by the RGA with the presence of the precursors and the reduction of byproduct gases exiting the final membrane), the flow of that the first reactive gas was terminated and the system was again flushed with a $N_2$ purge at a flow rate of 10 to 25 sccm. Once the purge was complete, the second reactive gas was released from the second supply tank in a similar manner (albeit a different port) until once again the three discs were fully saturated. Another flush with a $N_2$ purge at a flow rate of 10 to 25 sccm was performed. This cycle of additions, i.e., first reactive gas-purge-second reactive gas-purge) was continued the discs had undergone 35 iterations.

Figure 2:
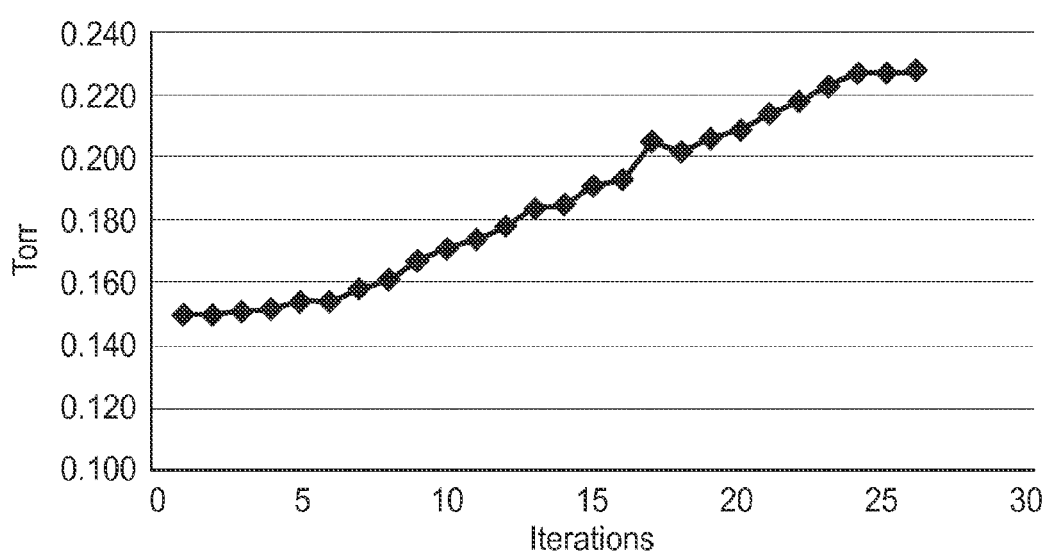
FIG. 2 shows a graph comparing an increase in pressure drop across the substrates compared to the number of process iterations during the experiment of Example 1.

At the completion of each iteration, the pressure differential within the reactor between the inlet and the outlet sides of the discs were observed at the end of the final purge with dry nitrogen. This data was recorded to determine the delta Pressure being caused by the addition of aluminum oxide throughout the membrane at a consistent gas flow rate. It was discovered that as the cycles progressed there was a detectable increase in pressure across the membranes for the process gas. This increase in delta pressure is illustrated by the graph shown in FIG. 2.

After the 35 iterations had been performed, the reactor was opened and the surface energy of each of the three discs of Sample A was assessed. Each disc was found to have a surface energy over 86 dyne/cm, indicating a high degree of hydrophilicity.

Example 2

An experiment was performed generally according to the procedure of Example 1, except that the substrate used was Substrate B instead of Substrate A; the reactor, the first and second inlet lines, and purge gas lines were heated to 60° C. with the heaters; and the number of iterations was 20 instead of 35. After the 20 iterations had been performed, the reactor was opened and the surface energy of each of the three discs of Sample B was assessed. Each disc was found to have a surface energy over 86 dyne/cm, indicating a high degree of hydrophilicity.

Example 3

An experiment was performed generally according to the procedure of Example 1, except that the substrate used was Substrate C instead of Substrate A; the reactor, the first and second inlet lines, and purge gas lines were heated to 60° C. with the heaters; and the number of iterations was 17 instead of 35. After the 17 iterations had been performed, the reactor was opened and the surface energy of each of the three discs of Sample C was assessed. Each disc was found to have a surface energy over 86 dyne/cm, indicating a high degree of hydrophilicity.

Example 4

An experiment was performed generally according to the procedure of Example 1, except that the substrate used was Substrate D instead of Substrate A; the reactor was heated to 60° C. with the heaters; the first and second inlet lines and purge gas lines were heated to 70° C. with the heaters; and the number of iterations was 20 instead of 35. After the 20 iterations had been performed, the reactor was opened. An X-ray analysis was performed to demonstrate that the substrate had been coated.

Example 5

An experiment was performed generally according to the procedure of Example 1, except that the substrate used was Substrate E instead of Substrate A; the reactor was heated to 60° C. with the heaters; the first and second inlet lines and purge gas lines were heated to 70° C. with the heaters; and the number of iterations was 20 instead of 35. After the 20 iterations had been performed, the reactor was opened. An X-ray analysis was performed to demonstrate that the substrate had been coated.

The complete disclosures of the publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

The invention claimed is:

1. A method for depositing a conformal coating on a porous non-ceramic substrate, comprising:
providing a reactor having an inlet and an outlet;
positioning at least a portion of at least one porous non-ceramic substrate such that the porous non-ceramic substrate separates the inlet from the outlet;
performing at least one iteration of sequentially introducing a first and a second reactive gas at the inlet such that the first and second reactive gases flow through the porous non-ceramic substrate to the outlet so as to conduct a sequence of two or more self-limiting reactions at the interior surfaces of the porous non-ceramic substrate to form a conformal coating on at least a portion of the interior surfaces; and
wherein the performing step is iterated until a surface energy of the interior surfaces is 72 dynes/cm or greater and the exterior surface of the porous non-ceramic substrate nearest the outlet has a surface energy less than 72 dynes/cm.

2. The method according to claim 1 wherein the porous non-ceramic substrate is a porous polymeric substrate, and wherein the introducing is done at a temperature below the melting temperature of the porous polymeric substrate.

3. The method according to claim 1 further comprising positioning at least a portion of at least a second porous non-ceramic substrate such that the second porous non-ceramic substrate also separates the inlet from the outlet.

4. The method according to claim 1 wherein the porous non-ceramic substrate is in the form of a web of material of indefinite length and the positioning means permits a roll-to-roll process.

5. The method according to claim 4 wherein the roll-to-roll process is a step-and-repeat process.

6. The method according to claim 4 wherein the roll-to-roll process is a continuous motion process.

7. The method according to claim 6 wherein at least one of the first or the second reactive gases comprises a non-reactive carrier gas component.

8. The method according to claim 1 wherein the reactor is in the form of a filter body.

9. The method according to claim 1 wherein the porous non-ceramic substrate is a porous polymer substrate.

10. The method according to claim 9 wherein the porous polymer substrate is a TIPS substrate, a stitchbonded non-woven web, a hydro-entangled non-woven web, a melt-blown non-woven web, or a spun-bonded non-woven web.

11. The method according to claim 1 wherein the conformal coating comprises a metal oxide, metal nitride, metal sulfide, or a combination thereof.

12. The method according to claim 11 wherein the metal is selected from the group consisting of silicon, titanium, aluminum, zirconium, and yttrium.

13. The method according to claim 11 wherein the conformal coating comprises aluminum oxide.

14. The method according to claim 1 wherein the temperature during the introducing of the first and second reactive gases is about 300° C. or less.

15. The method according to claim 14 wherein the temperature during the introducing of the first and second reactive gases is about 60° C. or less.

16. The method according to claim 1 further comprising grafting chemical moieties to the conformal coating.

17. The method according to claim 1 wherein a conformal coating is formed on all interior surfaces of the porous non-ceramic substrate.

18. The method according to claim 1 wherein the conformal coating is used to reduce the porosity of the porous non-ceramic substrate to achieve a desired porosity by controlling the number of iterations performed.

* * * * *